US007110229B2

(12) United States Patent
Yang et al.

(10) Patent No.: US 7,110,229 B2
(45) Date of Patent: Sep. 19, 2006

(54) ESD PROTECTION CIRCUIT AND DISPLAY PANEL USING THE SAME

(76) Inventors: Sheng-Chieh Yang, No. 120, Jhenfu St., Taoyuan City, Taoyuan County (TW) 330; An Shih, No. 98-1, Fan-Chin Rd., Yung-Le Tsun, Pu-Yen Hsiang, Changhua Hsien (TW) 516; Ming-Dou Ker, 4F-3, No. 3, Lane 200, Pao-Shan Rd., Lin 8, Kao-Feng Li, E. District, Hsinchu (TW) 300; Tang-Kui Tseng, No. 34, Alley 122, Lane 459, Guangming Rd., Jhudong Township, Hsinchu County (TW) 310

( * ) Notice: Subject to any disclaimer, the term of this patent is extended or adjusted under 35 U.S.C. 154(b) by 249 days.

(21) Appl. No.: 10/841,158

(22) Filed: May 7, 2004

(65) Prior Publication Data

US 2004/0264080 A1    Dec. 30, 2004

(30) Foreign Application Priority Data

May 9, 2003    (TW) ................................ 92112647 A

(51) Int. Cl.
*H02H 9/00*    (2006.01)

(52) U.S. Cl. ...................... 361/56; 257/170; 257/360; 257/355; 257/357; 257/361; 349/40; 349/54

(58) Field of Classification Search ................ 361/56; 257/355
See application file for complete search history.

(56) References Cited

U.S. PATENT DOCUMENTS

| | | | | |
|---|---|---|---|---|
| 5,528,188 A * | 6/1996 | Au et al. | ..................... | 327/310 |
| 5,946,177 A * | 8/1999 | Miller et al. | .................. | 361/56 |
| 6,538,708 B1 * | 3/2003 | Zhang | .......................... | 349/40 |
| 6,552,879 B1 * | 4/2003 | Voldman | ..................... | 360/323 |
| 2002/0066929 A1 * | 6/2002 | Voldman | ..................... | 257/355 |

* cited by examiner

*Primary Examiner*—Stephen W. Jackson
*Assistant Examiner*—Terrence Willoughby
(74) *Attorney, Agent, or Firm*—Quintero Law Office

(57) ABSTRACT

An ESD protection circuit for low temperature poly-silicon thin film transistor panel and a display panel using the same. The feature of the ESD protection circuit comprises an ESD detection circuit disposed between a first power line and a second power line, for outputting an enable signal when an ESD event occurs in the first power line; and a discharge device having a control terminal coupled to the output of the ESD detection circuit, for providing a discharge path between the first and second power lines when the control terminal receives the enable signal.

3 Claims, 6 Drawing Sheets

ESD PROTECTION CIRCUIT AND DISPLAY PANEL USING THE SAME

BACKGROUND OF THE INVENTION

1. Field of the Invention

The present invention relates to an electrostatic discharge (ESD) protection circuit and its application, and in particular relates to an ESD protection circuit for thin film transistor (TFT) liquid crystal display (LCD) panel and a display panel using the same for ESD protection.

2. Description of the Related Art

ESD management is an increased reliability issue in complementary metal oxide semiconductor (CMOS) integrated circuits (ICs) due to technology scaling and high frequency requirements. For example in radio frequency (RF) ICs, on-chip ESD protection design suffers from several limitations, such as low parasitic capacitance, constant input capacitance, insensitivity to substrate coupling noises, and robust ESD protection. In order to fulfill these requirements, diodes are commonly used for ESD protection in I/O circuits.

In the above, the power-rail ESD clamp circuit is important in improving the ESD protection in IC products. As well, the power-rail ESD clamp circuit must be triggered efficiently during ESD events.

TFT LCD display panels accumulate significant charge in the manufacturing process, for example low temperature poly-silicon (LTPS) process, posing danger to transistors of internal driving circuit.

In general, ESD protection circuits for LTPS TFT panels, use a diode between $V_{DD}$ and $V_{SS}$ lines. The diode is turned on, providing a discharge path for a transient current when ESD events occur in the $V_{DD}$ line or the $V_{SS}$ line. However, a bias still exist between the $V_{DD}$ and $V_{SS}$ lines and generates discharge effect in internal circuits. Thus, the above method is unable to enhance the ESD protection.

SUMMARY OF THE INVENTION

It is therefore an object of the present invention to provide an ESD protection circuit for TFT LCD display panel, especially for low temperature poly-silicon (LTPS) TFT LCD display panel and a display device using the same.

The ESD protection circuit comprises first and second power lines, an ESD detection circuit, and a discharge device. The ESD detection circuit is connected between the first power line and the second power line. The ESD detection circuit outputs an enable signal when an ESD event occurs in the first power line. The discharge device has a control terminal (CTR) coupled to the output terminal of the ESD detection circuit, a first terminal coupled to the first power line, and a second terminal coupled to the second power line. The discharge device thereby provides a discharge path when the control terminal receives the enable signal.

The ESD detection circuit comprises a resistor, a capacitor, a first thin film transistor, and a second thin film transistor. The resistor has a first terminal coupled to the first power line. The capacitor has a first terminal coupled to a second terminal of the resistor and a second terminal coupled to the second power line. The first thin film transistor has a gate coupled to the second terminal of the resistor, a source coupled to the first power line, and a drain coupled to the control terminal (CTR). The second thin film transistor has a gate coupled to the second terminal of the resistor, a source coupled to the second power, and a drain coupled to the drain of the first thin film transistor.

In addition, the display panel with the ESD protection circuit comprises a plurality of gate lines, a plurality of data lines, a plurality of display units, a gate driver, a data driver, at least one first power line and at least one second power line, and at least an ESD protection circuit disposed between the first and second power lines. The main feature of the ESD protection circuit in the display panel is the same as that described above.

BRIEF DESCRIPTION OF THE DRAWINGS

The present invention can be more fully understood by the subsequent detailed description and examples with reference made to the accompanying drawings, wherein.

DETAILED DESCRIPTION OF THE INVENTION

Figure 1:
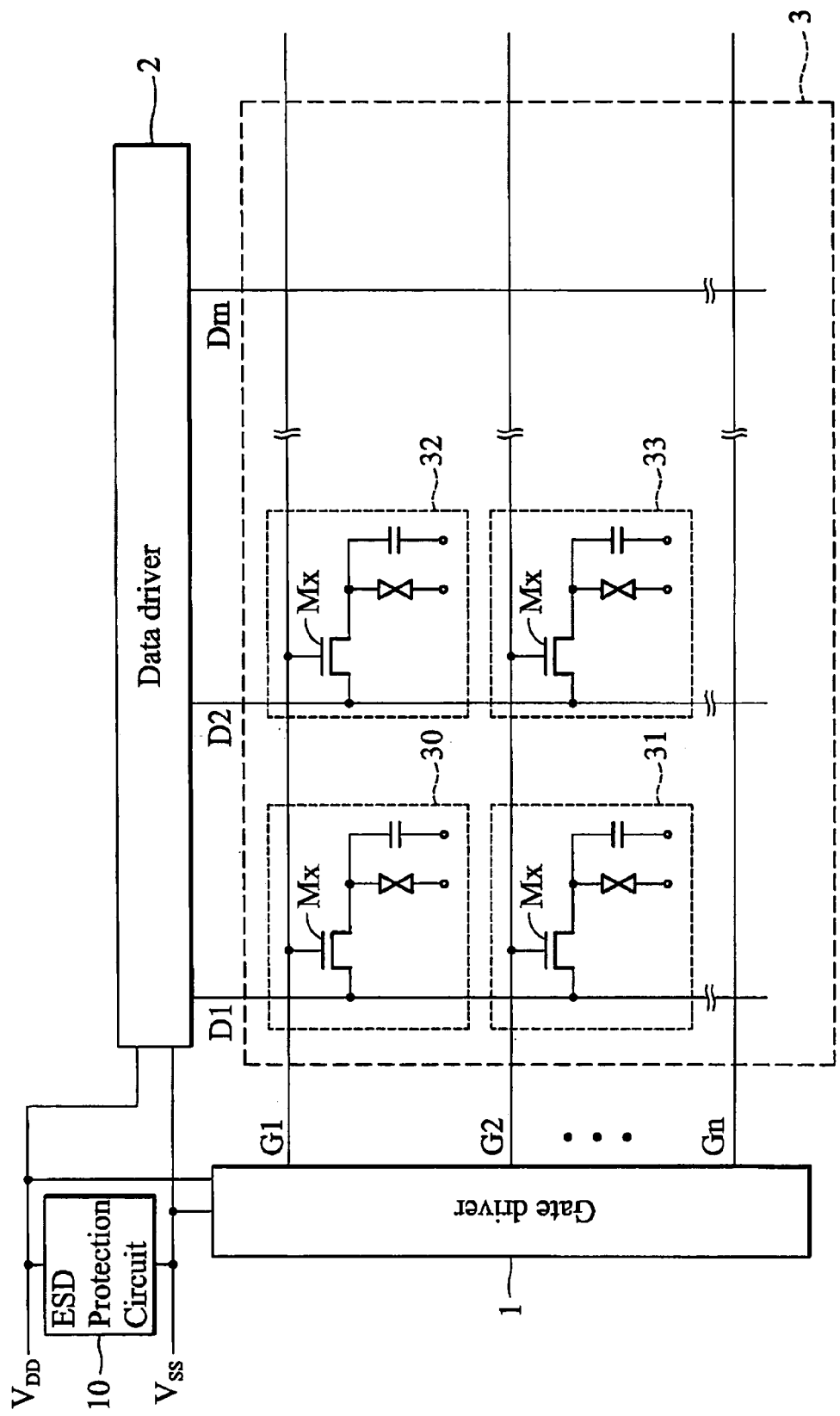
FIG. 1 shows a TFT LCD display panel with ESD protection circuit of the present invention.

FIG. 1 shows a TFT display panel with ESD protection circuit 10 of the present invention. The display panel comprises a gate driver 1, a data driver 2, a display array 3, and an electrostatic discharge (ESD) protection circuit 10 disposed between a first power line $V_{DD}$ and a second power line $V_{SS}$.

The display array 3 comprises a plurality of gate lines G1~Gn, a plurality of data lines D1~Dm, and a plurality of display units 30~33 (only 4 units depicted in FIG. 1). Each of the display units comprises a thin film transistor Mx, which can be LTPS TFT or amorphous silicon(a-Si) TFT, and connected to the corresponding gate lines and data lines. The gate driver 1 outputs scan signals to gate lines G1~Gn. The data driver 2 outputs video signals to data lines D1~Dm.

The electrostatic discharge (ESD) protection circuit 10 is used to provide a discharge path when an ESD event occurs in the first power line $V_{DD}$ during fabricating the TFT LCD display panel, thus providing ESD protection to the display panel. The ESD protection circuit 10 is described in detail as follows.

Figure 2:
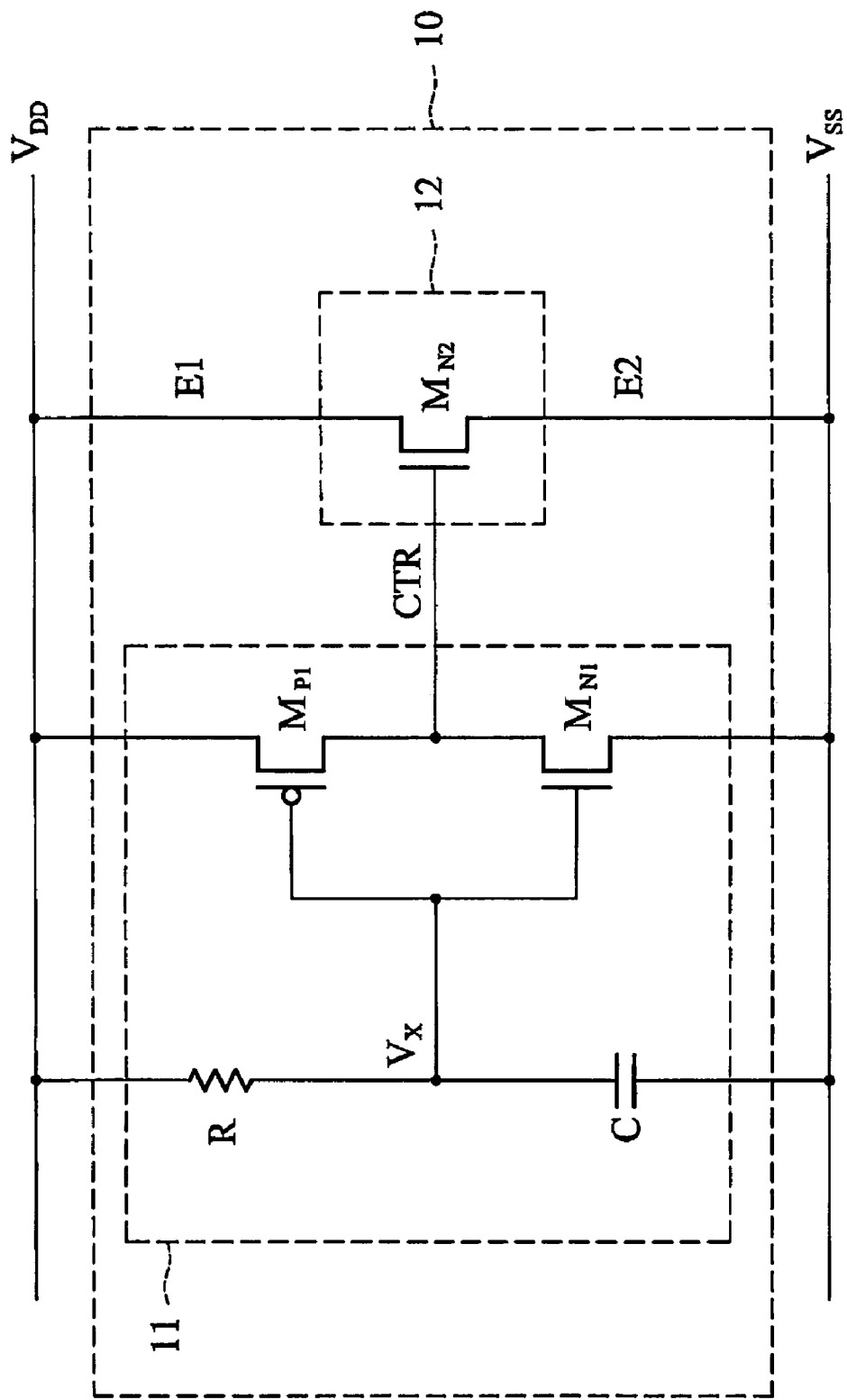
FIG. 2 shows a first embodiment of the ESD protection circuit.

FIG. 2 shows one embodiment of the ESD protection circuit. The ESD protection circuit 10, disposed between the first power line $V_{DD}$ and the second power line $V_{SS}$, comprises an ESD detection circuit 11, and a discharge device 12. The ESD detection circuit 11 is connected between the first power line $V_{DD}$ and the second power line $V_{SS}$. When the ESD event occurs in the first power line $V_{DD}$, the ESD detection circuit 11 outputs an enable signal. The discharge device 12 has a control terminal CTR coupled to the output of the ESD detection circuit 11, a first terminal E1 coupled to the first power line $V_{DD}$, and a second terminal E2 coupled to the second power line $V_{SS}$. The discharge device 12 provides a discharge path for the ESD when the control terminal CTR receives the enable signal.

In FIG. 2, the ESD detection circuit 11 comprises a resistor R, a capacitor C, a first P-type thin film transistor $M_{P1}$, and a second N-type thin film transistor $M_{N1}$. The resistor R has a first terminal coupled to the first power line $V_{DD}$. The capacitor C has a first terminal coupled to a second terminal of the resistor R and a second terminal coupled to the second power line $V_{SS}$. The first P-type thin film transistor $M_{P1}$, has a gate coupled to the second terminal of the resistor R, a source coupled to the first power line $V_{DD}$, and a drain coupled to the control terminal CTR of the discharge device 12. The second N-type thin film transistor $M_{N1}$ has a gate coupled to the second terminal of the resistor R, a source coupled to the second power $V_{SS}$, and a drain coupled to the drain of the first N-type thin film transistor $M_{P1}$.

The discharge device 12 is an N-type thin film transistor $M_{N2}$ with a gate (the control terminal CTR) coupled to the drain of the first P-type thin film transistor $M_{p1}$, a source coupled to the first power line $V_{DD}$, and a drain coupled to the second power line $V_{SS}$.

The resistor R and capacitor C define a delay constant exceeding the duration of the ESD pulse (generally about several hundred nano-seconds). When the ESD pulse (e.g. with positive voltage) occurs in the first power line $V_{DD}$ during fabricating process, the voltage at the point Vx is less than that of the ESD pulse. Therefore, a voltage difference between the gate and source of the PMOS transistor $M_{P1}$ is induced. When the voltage difference exceeds the threshold voltage of the PMOS transistor $M_{P1}$, the PMOS transistor $M_{P1}$ turns on and pulls up the voltage at the control terminal CTR (outputs the enable signal), whereby the NMOS transistor $M_{N2}$ is turned on to provide a discharge path for dissipating the ESD current from the first power line $V_{DD}$ to the second power line $V_{SS}$.

Figure 3:
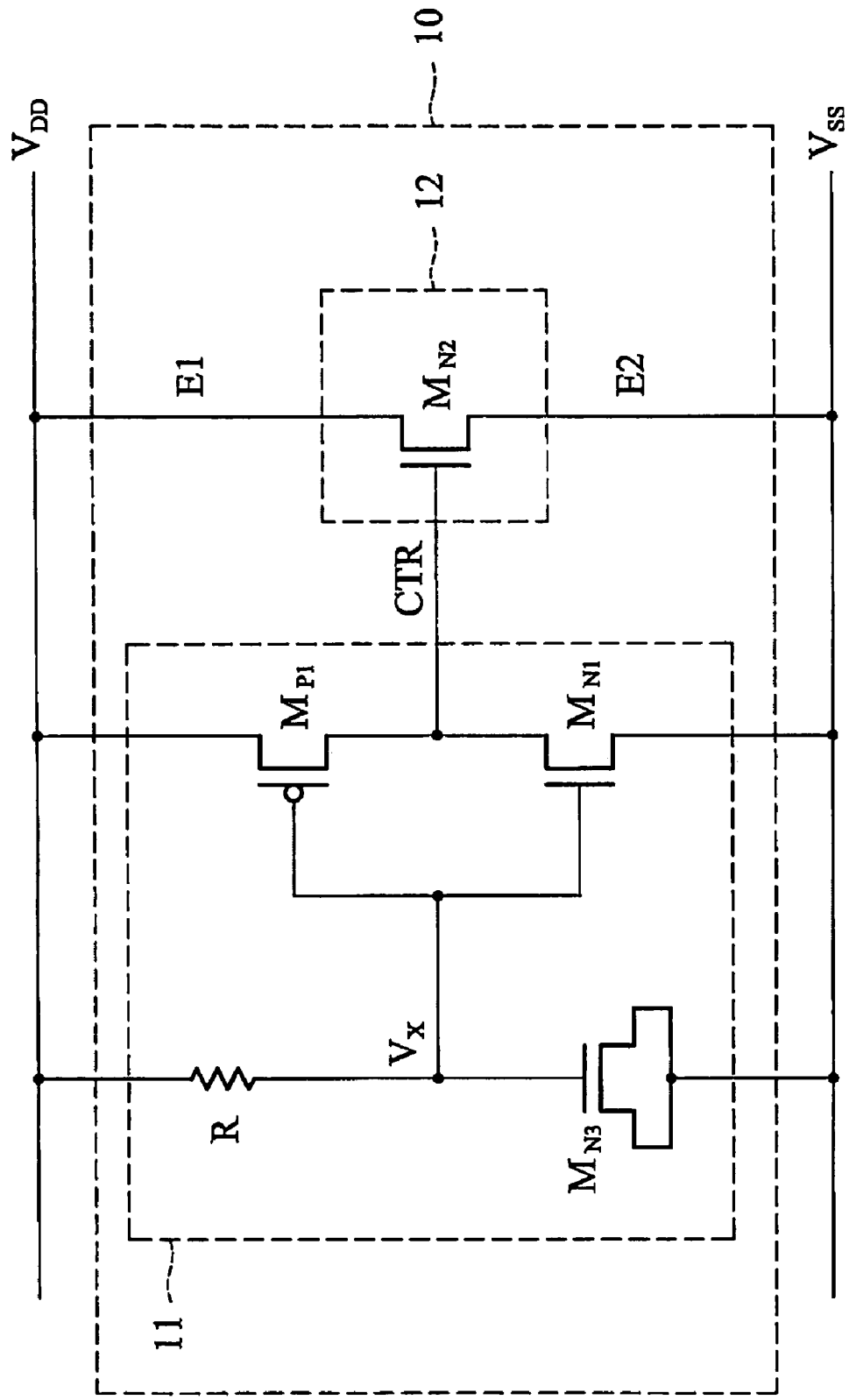
FIG. 3 shows a second embodiment of the ESD protection circuit.

FIG. 3 shows a second embodiment of the ESD protection circuit. The capacitor C is a third N-type thin film transistor $M_{N3}$ with a gate coupled to the second terminal of the resistor R and a source and drain coupled to the second power line $V_{SS}$.

Figure 4:
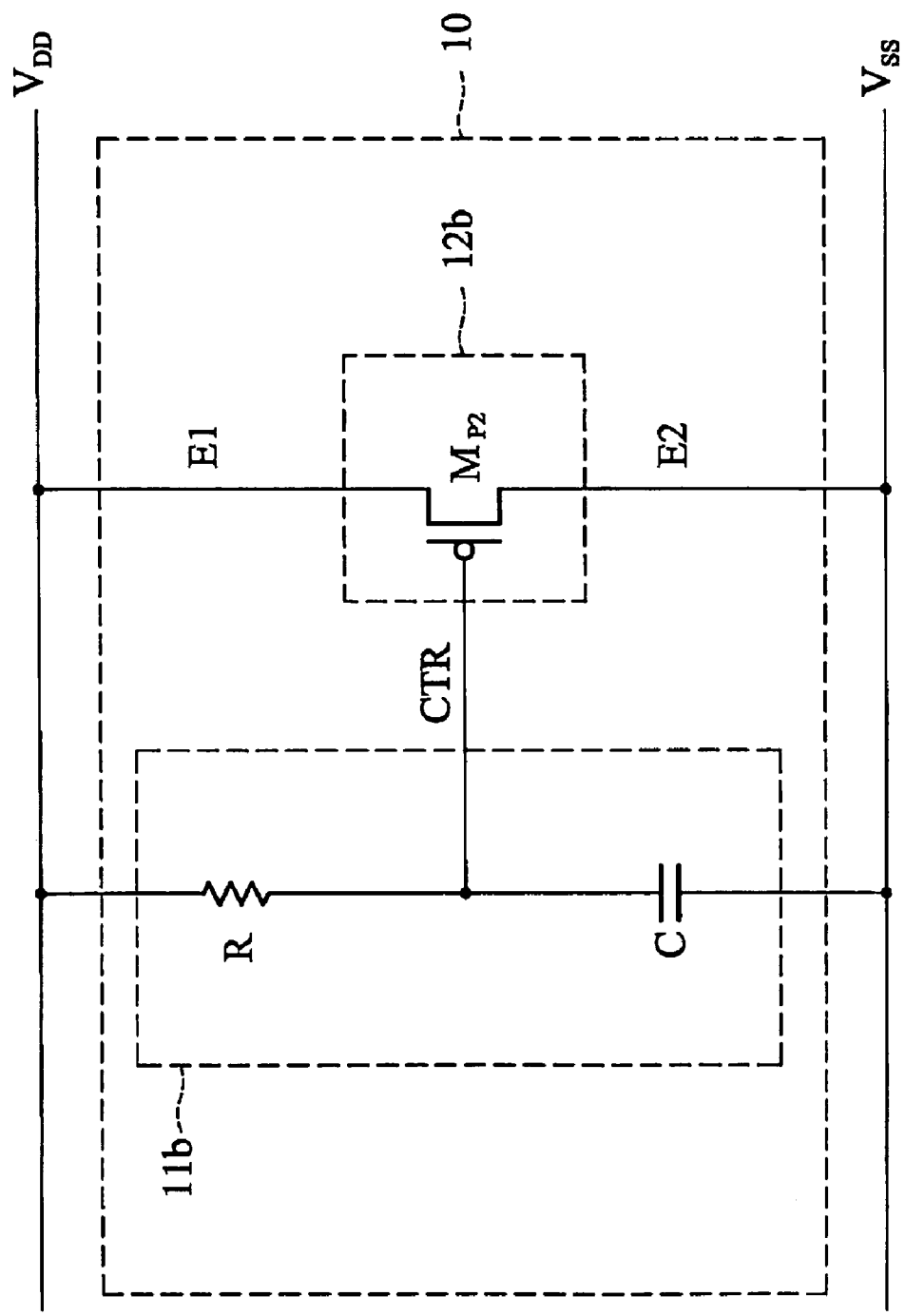
FIG. 4 shows a third embodiment of the ESD protection circuit.

FIG. 4 shows a third embodiment of the ESD protection circuit. The ESD detection circuit 11b comprises a resistor R and a capacitor C. The resistor R has a first terminal coupled to the first power line $V_{DD}$. The capacitor C has a first terminal coupled to a second terminal of the resistor R and a second terminal coupled to the second power line $V_{SS}$. The discharge device 12b is a P-type thin film transistor $M_{P2}$ with a gate coupled to the second terminal of the resistor R, a source coupled to the first power line $V_{DD}$, and a drain coupled to the second power line $V_{SS}$.

Similarly, the resistor R and capacitor C define a delay constant exceeding the duration of the ESD pulse. When the ESD pulse occurs in the first power line $V_{DD}$ during fabricating process, the voltage at control terminal CTR is less than that of the ESD pulse. Therefore, a voltage difference between the gate and source of the PMOS transistor $M_{P2}$ is induced. When the voltage difference exceeds the threshold voltage of the PMOS transistor $M_{P2}$, the PMOS transistor $M_{P2}$ turns on to provide a discharge path for dissipating the ESD current from the first power line $V_{DD}$ to the second power line $V_{SS}$.

Figure 5:
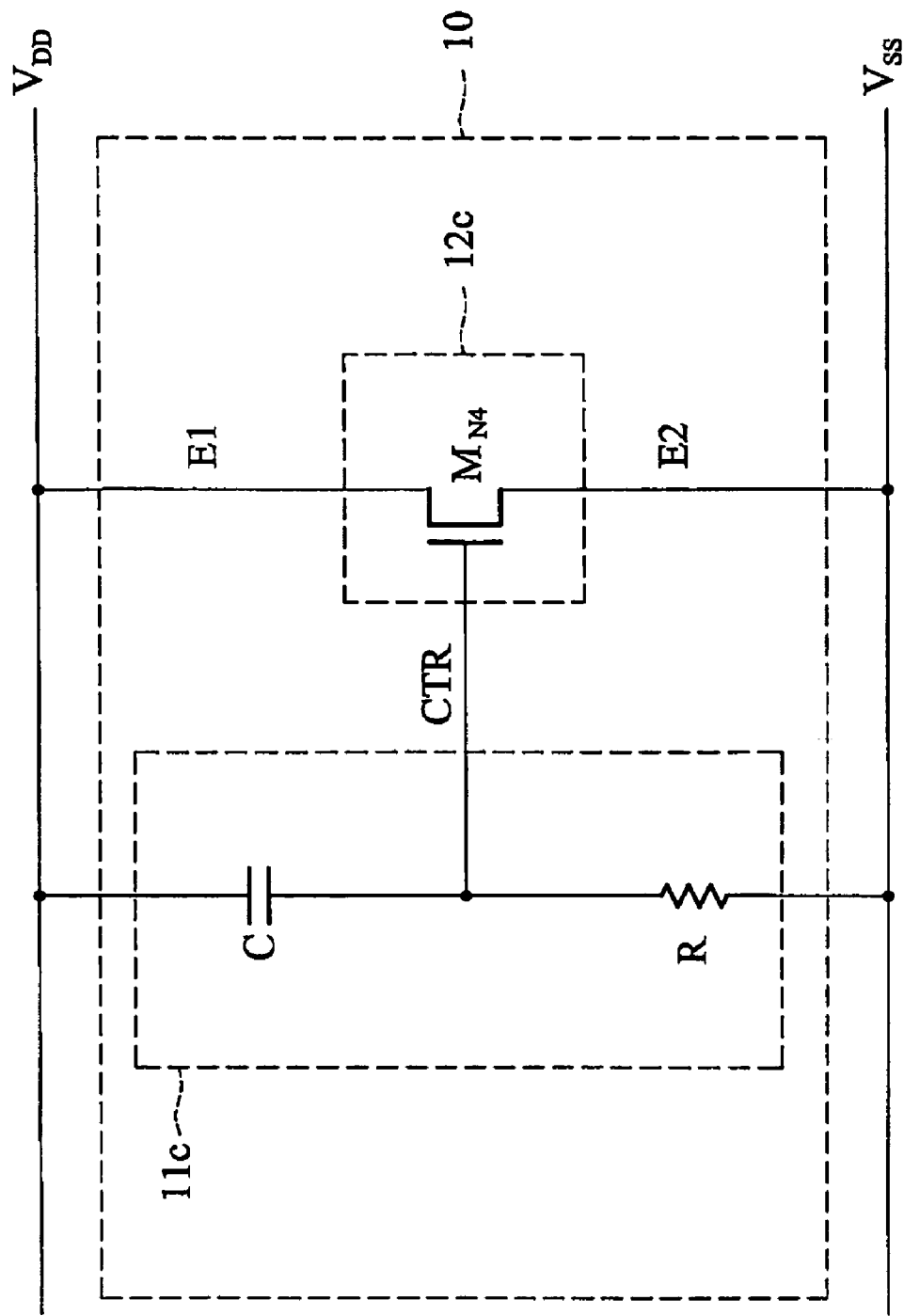
FIG. 5 shows a fourth embodiment of the ESD protection circuit.

FIG. 5 shows a fourth embodiment of the ESD protection circuit. The ESD detection circuit 11c comprises a capacitor C and a resistor R. The capacitor C has a first terminal coupled to the power line $V_{DD}$. The resistor R has a first terminal coupled to a second terminal of the capacitor C and a second terminal coupled to the power line $V_{SS}$. The discharge device 12c is an N-type thin film transistor $M_{N4}$ that has a gate coupled to the second terminal of the capacitor C, a source coupled to the power line $V_{SS}$, and a drain coupled to the power line $V_{DD}$.

Similarly, the resistor R and capacitor C define a delay constant exceeding the duration of the ESD pulse. When the ESD pulse (e.g. with negative voltage) occurs in the power line $V_{SS}$ during fabricating process, the voltage at control terminal CTR is higher than that of the ESD pulse (at the power line $V_{SS}$). Therefore, a voltage difference between the gate and source of the NMOS transistor $M_{N4}$ is induced. When the voltage difference exceeds the threshold voltage of the NMOS transistor $M_{N4}$, the NMOS transistor $M_{N4}$ turns on to provide a discharge path for dissipating the ESD current from the power line $V_{SS}$ to the power line $V_{DD}$.

Figure 6:
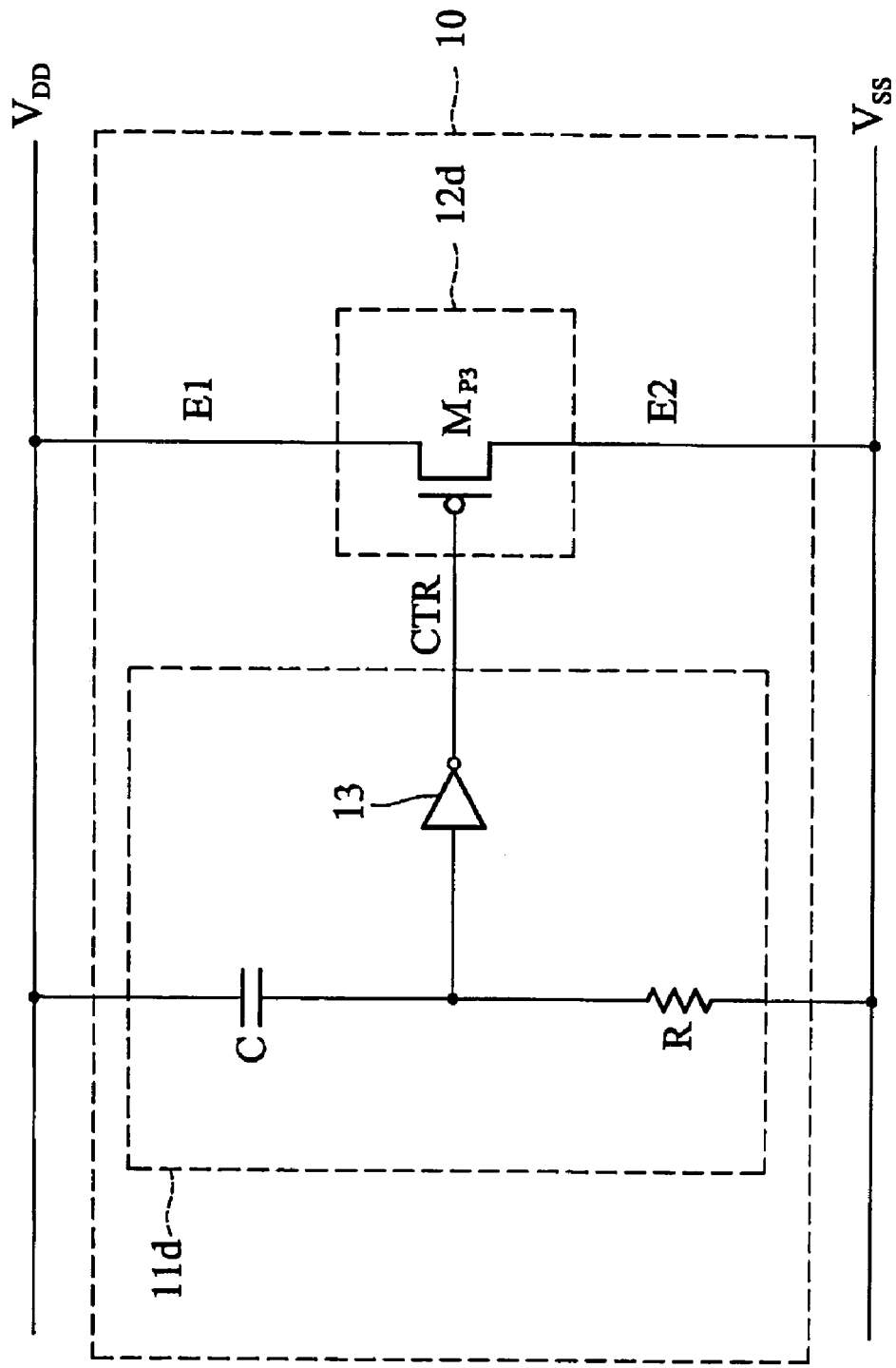
FIG. 6 shows a fifth embodiment of the ESD protection circuit.

FIG. 6 shows a fifth embodiment of the ESD protection circuit. The ESD detection circuit 11d comprises a capacitor C, a resistor R, and an inverter 13. The capacitor C has a first terminal coupled to the power line $V_{DD}$. The resistor R has a first terminal coupled to a second terminal of the capacitor C and a second terminal coupled to the power line $V_{SS}$. The inverter 13 has an input terminal coupled to the second of the capacitor C and a second output terminal coupled the control terminal CTR. The discharge device 12d is a P-type thin film transistor $M_{P3}$ with a gate coupled to the second output terminal of the inverter 13, a source coupled to the power line $V_{DD}$, and the drain couples to the power line $V_{SS}$. In this embodiment, the inverter 13 and the PMOS transistor $M_{P3}$ jointly perform the same function as the NMOS transistor $M_{N4}$ depicted in FIG. 5.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An electrostatic discharge (ESD) protection circuit for thin film transistor display panel comprising:
   a first power line;
   a second power line;
   a resistor having a first terminal coupled to the first power line;
   a capacitor having a first terminal coupled to a second terminal of the resistor and a second terminal coupled to the second power line wherein the second terminal of the resistor outputs an enable signal when an ESD event occurs in the first power line; and
   a P-type thin film transistor with a gate coupled to the second terminal of the resistor, a source coupled to the first power line, and a drain coupled to the second power line, wherein the P-type thin film transistor provides a discharge path between the first and second power lines when the gate receives the enable signal.

2. An electrostatic discharge (ESD) protection circuit for thin film transistor display panel comprising:
   a first power line;
   a second power line;
   a capacitor having a first terminal coupled to the first power line;
   a resistor having a first terminal coupled to a second terminal of the capacitor and a second terminal coupled to the second power line, wherein the second terminal of the capacitor outputs an enable signal when an ESD event occurs in the first power line; and an N-type thin film transistor with a gate coupled to the second terminal of the capacitor, a source coupled to the second power line, and a drain coupled to the first power line, wherein the N-type thin film transistor provides a discharge path between the first and second power lines when the gate receives the enable signal.

3. An electrostatic discharge (ESD) protection circuit for thin film transistor display panel comprising:

a first power line;

a second power line;

a capacitor having a first terminal coupled to the first power line;

a resistor having a first terminal coupled to a second terminal of the capacitor and a second terminal coupled to the second power line;

an inverter having a first terminal coupled to the second terminal of the capacitor and a second terminal outputting an enable signal when an ESD event occurs in the first power line; and a P-type thin film transistor with a gate coupled to the second terminal of the inverter, a source coupled to the first power line, and a drain coupled to the second power line, wherein the P-type thin film transistor provides a discharge path between the first and second power lines when the gate receives the enable signal.

* * * * *